United States Patent
Miyata et al.

[11] Patent Number: 5,903,159
[45] Date of Patent: May 11, 1999

[54] MICROWAVE SENSOR FOR SENSING DISCHARGE FAULTS

[75] Inventors: Tomoyuki Miyata; Hiroshi Otani, both of Hyogo, Japan

[73] Assignee: Mitsubishi Denki Kabushiki Kaisha, Tokyo, Japan

[21] Appl. No.: 08/985,754

[22] Filed: Dec. 5, 1997

Related U.S. Application Data

[62] Division of application No. 08/630,817, Apr. 10, 1996, Pat. No. 5,726,576.

[51] Int. Cl.⁶ .......................... G01R 31/12; G01R 31/302
[52] U.S. Cl. ............................ 324/536; 324/520; 324/750
[58] Field of Search ..................................... 324/501, 520, 324/536, 537, 541, 544, 551, 750

[56] References Cited

U.S. PATENT DOCUMENTS

| | | | |
|---|---|---|---|
| 5,373,241 | 12/1994 | Ham, Jr. et al. | 324/536 |
| 5,726,577 | 3/1998 | Engel et al. | 324/536 |
| 5,729,144 | 3/1998 | Cummins | 324/536 |

*Primary Examiner*—Glenn W. Brown
*Attorney, Agent, or Firm*—Rothwell, Figg, Ernst & Kurz

[57] ABSTRACT

A microwave sensor includes a case 1 of an object apparatus in which a discharge may occur; the object apparatus 2; an antenna 3 which is attached to the object apparatus case 1 and receives a microwave signal generated by a discharge; a signal processing unit 4 which is connected to the antenna 3, amplifies and detects the microwave signal, mixes the microwave signal with an oscillating signal, converts the mixed signal to a video signal, and amplifies the video signal; and an output terminal 13 through which the video signal is output.

4 Claims, 11 Drawing Sheets

FIG. 12A
PRIOR ART
FIG. 12B
PRIOR ART
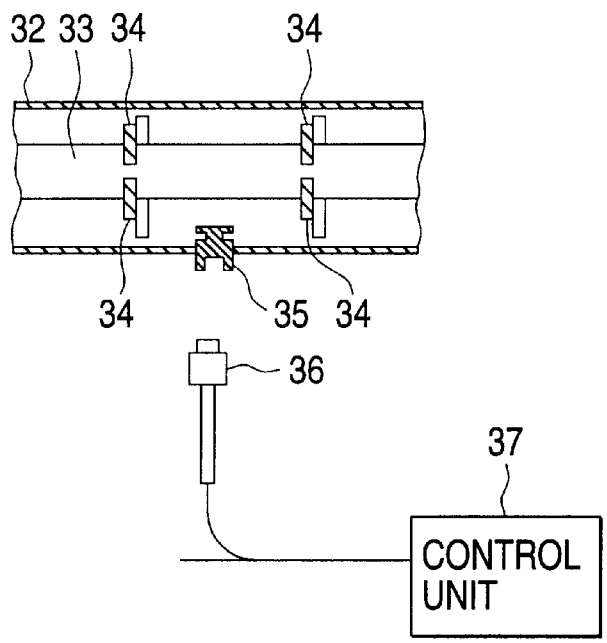
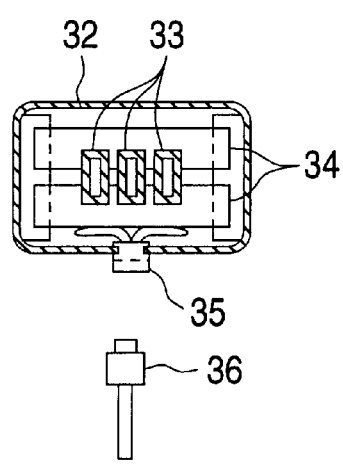
FIG. 13
PRIOR ART
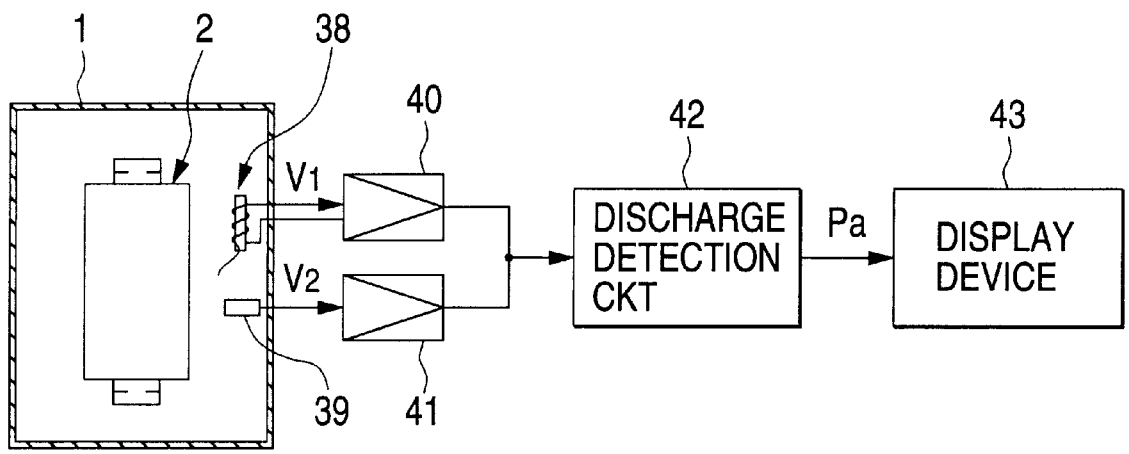

MICROWAVE SENSOR FOR SENSING DISCHARGE FAULTS

This is a divisional of application Ser. No. 08/630,817, filed Apr. 10, 1996, now U.S. Pat. No. 5,726,576.

BACKGROUND OF THE INVENTION

1. Field of the Invention

The invention relates to a device which detects a discharge caused by deterioration, an abnormality, or the like of an electric apparatus.

2. Description of the Related Art

A dielectric breakdown accident which is one of serious accidents of an electric power apparatus is often accompanied by a partial discharge as a forerunning phenomenon. When a partial discharge is detected, therefore, an abnormality in the insulation of an electric power apparatus can be detected at an early stage or in an insignificant state in which a dielectric breakdown accident will not be caused. In an electric power apparatus, the preventive maintenance technique is important. Consequently, it is requested to provide an electric power apparatus with a sensor for fault diagnosis.

In the case of a partial discharge due to insulation deterioration or the like, when such a discharge once occurs in an electric power apparatus, phenomena such as generation of an electromagnetic wave, variation of the electromagnetic field, generation of a discharge pulse current, generation of discharge noise, and chemical changes of insulating materials are produced. Conventionally, various methods of detecting a partial discharge which use such phenomena have been proposed.

FIGS. 9 and 10 are diagrams showing a prior art discharge detection method which is based on the detection of a discharge current and which is disclosed in Institute of Electrical Engineers of Japan, "State and Trend of Preventive Maintenance Technique for Transformer", Technical Report of Institute of Electrical Engineers of Japan (Part II), No. 344, August 1990 (Expert Committee on Preventive Maintenance of Transformer). In the figure, reference numeral 21 designates an object apparatus in which a discharge is to be detected, 22 designates a high-voltage capacitor, 23 designates a pulse transformer, 24 designates an amplifier, and 25 designates an observation apparatus such as an oscilloscope.

Next, the operation will be described. The high-voltage capacitor 22 is connected to the object apparatus 21, and grounded through the pulse transformer 23. The potential oscillation due to a discharge in the object apparatus 21 appears in the form of a charging/discharging pulse current of the high-voltage capacitor 22. This current is converted into a voltage by the pulse transformer 23. The voltage is amplified by the amplifier 24 and then observed on the oscilloscope 25 or the like.

FIG. 10 is a diagram showing another discharge detection method which is based on the detection of a discharge current. In the figure, reference numeral 21 designates an object apparatus in which a discharge is to be detected, 26 designates a Rogowski coil, 24 designates an amplifier, and 25 designates an observation apparatus such as an oscilloscope.

Next, the operation will be described. A pulse current due to a discharge or the like is taken out by the Rogowski coil 26, etc. which is electromagnetically coupled with a grounding conductor for the object apparatus 21. The pulse current is amplified by the amplifier 24 and then observed on the oscilloscope 25 or the like.

In both the methods, the frequency is in a wide band from hundreds kHz to about 1 MHZ. The circuit is connected to the apparatus via a conductor and captures a high-frequency signal generated over a wide range in a network of distributed constant circuits which are coupled with each other by spatial capacitances. Consequently, it is very difficult to distinguish an internal discharge to be observed from external noise. In a field, the S/N ratio is often so poor that the minimum detection level becomes high with the result that such a method cannot be practically used.

FIG. 11 is a diagram showing a prior art discharge detection method which is based on the detection of a discharge noise and which is disclosed in Institute of Electrical Engineers of Japan, "State and Trend of Preventive Maintenance Technique for Transformer", Technical Report of Institute of Electrical Engineers of Japan (Part II), No. 344, August 1990 (Expert Committee on Preventive Maintenance of Transformer). In the figure, reference numeral 27 designates an interior of an object apparatus which is filled with oil or the like, 28 designates a tank wall of the object apparatus, 29 designates a piezoelectric device, 30 designates a magnet plate, and 31 designates a cable. The components 29 to 31 constitute an ultrasonic microphone.

In the method, the ultrasonic microphone is attached to the tank wall 28 of the object apparatus and discharge noise is then detected. However, the sensitivity cannot be increased to a sufficient level. In a field, it is difficult to remove noise such as a sound produced by collision of rain drops or sand grains with the object apparatus.

In another prior art method, decomposition products are chemically analyzed. According to the method, a fluid insulator (oil or gas) in which organic insulators that are thermally decomposed by a discharge are dissolved is collected and then analyzed. An abnormality in the insulation is judged on the basis of the components of the collected gas. The judgment involves a prolonged time period, and requires expert knowledge of thermal decomposition characteristics of insulators and experience.

Prior art methods of detecting an electromagnetic wave generated by a discharge and components of the electromagnetic field are disclosed in Japanese Patent Unexamined Publication No. SHO 62-134574 "CORONA DISCHARGE DETECTOR", Japanese Patent Unexamined Publication No. HEI 2-297078 "ABNORMALITY DETECTOR FOR AN ELECTRIC APPARATUS", Japanese Patent Unexamined Publication No. HEI 3-81674 "PARTIAL DISCHARGE DETECTOR FOR AN ELECTRIC APPARATUS", and Japanese Patent Unexamined Publication HEI 3-239971 "CORONA DISCHARGE DETECTOR".

FIGS. 12A and 12B are diagrams showing the corona discharge detector disclosed in Japanese Patent Unexamined Publication No. SHO 62-134574 "CORONA DISCHARGE DETECTOR". In the figure, reference numeral 33 designates a conductor through which a high-voltage current flows and which is fixed to a metal duct 32 via support plates 34, and 35 designates an antenna which detects an electromagnetic wave generated by a corona discharge occurring in the duct and which is fixed to the duct 32. Only when the detection is to be conducted, the antenna 35 is connected to a control unit 37 via a connector 36.

Next, the operation will be described. When a corona discharge occurs, an electromagnetic wave is generated by the discharge. The antenna is previously disposed at various positions of the duct. In a patrol or the like, the portable control unit is connected to the antennas in sequence so that the detection is conducted. When an electromagnetic wave generated by a corona discharge is detected, it is judged that a corona discharge occurs.

In this system, the antennas are separated from the control unit, and hence the detect on cannot be conducted in real time. Consequently, the system has a drawback that a discharge cannot be detected unless an electromagnetic wave is generated when the control unit is connected to one of the antennas. In other words, the system is effective in the case where insulation deterioration advances to a level where a continued discharge is conducted, but may fail to detect a discharge in the case where insulation deterioration is in an initial stage and a discharge occurs only in a discrete manner.

FIGS. 13 and 14 show prior art examples disclosed in Japanese Patent Unexamined Publication No. HEI 2-297078 "ABNORMALITY DETECTOR FOR AN ELECTRIC APPARATUS" and Japanese Patent Unexamined Publication No. HEI 3-81674 "PARTIAL DISCHARGE DETECTOR FOR AN ELECTRIC APPARATUS". In the figures, reference numeral 38 designates a magnetic sensor in which a wire is wound around a magnetic core plural times in order to detect the magnetic field component of an electromagnetic wave generated by a partial discharge, 39 designates a sound receiving device which receives an ultrasonic wave generated by a partial discharge, 40 designates an amplifier-A, 41 designates an amplifier-B, 42 designates a discharge detection circuit, 37 designates a light receiving sensor for ultraviolet rays generated by a partial discharge, and 43 designates a display device.

Next, the operation will be described. Referring to FIG. 13, when a partial discharge occurs in an object apparatus 2, an electromagnetic wave and an ultrasonic wave are generated by the partial discharge. The electromagnetic wave is detected by the magnetic sensor 38. The detected electromagnetic wave is amplified by the amplifier-A 40 and then transmitted to the discharge detection circuit 42. The ultrasonic wave is detected by the sound receiving device 39. The detected ultrasonic wave is amplified by the amplifier-B 41 and then transmitted to the discharge detection circuit 42. When the discharge detection circuit receives inputs from both the magnetic sensor and the sound receiving device, the circuit judges that a discharge occurs, and the display device 43 is started to operate. When the discharge detection circuit receives an input from only one of the magnetic sensor and the sound receiving device, it is judged that there occurs a disturbance. In the apparatus shown in FIG. 14, the sound receiving device is replaced with the light receiving sensor for detecting ultraviolet rays generated by a partial discharge.

In this system, in order to distinguish a disturbance entering a magnetic sensor so as to improve the detection accuracy, the method in which an electromagnetic wave generated by a partial discharge is detected by the magnetic sensor is used together with the other method which uses the sound receiving device or the light receiving sensor. Consequently, the system has a drawback that the use of the plural sensors makes the system complicated in structure. The magnetic sensor has a structure in which a winding is formed on a magnetic core. Such a structure can detect an electromagnetic wave the frequency of which is several MHZ at the highest. Since electromagnetic waves of this frequency band are already used in many applications with leaving no space between frequencies, it is difficult to prevent a disturbance from entering the magnetic sensor, with the result that the system must be used conjointly with another system.

FIGS. 15A and 15B show a prior art example disclosed in Japanese Patent Unexamined Publication No. HEI 3-239971 "CORONA DISCHARGE DETECTOR". In the figure, reference numeral 45 designates a sensor unit, and 46 designates a group of micro-loop antennas which are different from each other in electromagnetic induction frequency and which cover the frequency range of 10 kHz to 1 GHz as a whole. Reference numeral 47 designates a coaxial cable, 48 designates an apparatus to be measured, 49 designates a comparison detector, 50 designates a dummy antenna for noise detection, 51 designates a CPU, 52 designates a RAM, 53 designates a ROM, 54 designates a CRT, and 55 designates a printer.

Next, the operation will be described. An electromagnetic wave is generated by a corona discharge occurring as a result of insulation deterioration of the apparatus 48 to be measured. The components of 10 kHz to 1 GHz of the electromagnetic wave are received by the antenna 46 and then supplied to the comparison detector 49 through the coaxial cable 47. Noise of the space is received by the dummy antenna 50 and then supplied to the comparison detector 49. The electromagnetic wave generated by the discharge, and the noise are compared with each other, and the comparison output is produced by the comparison detector. The comparison output is processed by the CPU 51 and then displayed on the CRT 54 and the printer 55.

In this system, since an electromagnetic wave generated by a discharge must be received in a wide band from 10 kHz to 1 GHz, a plurality of antennas are required. This frequency band is already used in many applications, and hence an external antenna for reference must be disposed in order to distinguish the electromagnetic wave from external noise.

Since the prior art methods of detecting a discharge are configured as described above, the methods are easily affected in a field by a disturbance. In order to correctly capture a discharge phenomenon, therefore, plural detection methods and a noise eliminating apparatus must be conjointly used.

In the prior art methods in which an electromagnetic wave generated by a discharge is detected, the object frequency is not higher than 1 GHz. An electromagnetic wave generated by a discharge has a wide frequency spectrum as shown in FIG. 16 which extends from a low frequency of several kHz to a microwave of ten-odd GHz, and has a characteristic in which its distribution is substantially proportional to 1/f (where f is a frequency). When a discharge is to be detected on the basis of an electromagnetic wave, therefore, the detection can be conducted efficiently in a configuration in which an electromagnetic wave of a low frequency is received. In the prior art, a configuration which utilizes a microwave is not used. The low-frequency region useful in the configuration in which an electromagnetic wave of a low frequency is received is in a range where electromagnetic waves are used in an overcrowded manner. Therefore, the configuration has a defect that it is easily affected by another electromagnetic wave, and hence must be used conjointly with a noise/disturbance removing apparatus.

SUMMARY OF THE INVENTION

The invention has been conducted in order to solve the above-discussed problems and accomplished with paying attention to the fact that the range of an electromagnetic wave generated by a discharge extends to a microwave region. Therefore, an object of the invention is to provide a microwave sensor in which frequency components in the microwave band are extracted and which detects a discharge easily, correctly, and in real time and which is hardly affected by a disturbance.

According to one aspect of the invention, there is provided a microwave sensor, which comprises: an antenna unit which is to be placed in the vicinity of an electric apparatus and which receives a microwave signal generated by a discharge occurring in the electric apparatus; a first band-pass filter which allows a predetermined frequency of the microwave signal received by the antenna unit to pass through the filter; amplifying means for amplifying the microwave signal output from the first band-pass filter; a second band-pass filter which removes noise produced by the amplifying means; converting means for converting the microwave signal output from the second band-pass filter into a video signal; and video amplifying means for amplifying the video signal output from the converting means.

According to another aspect of the invention, there is provided a microwave sensor, which comprises: an antenna unit which is to be placed in the vicinity of an electric apparatus and which receives a microwave signal generated by a discharge occurring in the electric apparatus; a first band-pass filter which allows a predetermined frequency of the microwave signal received by the antenna unit to pass through the filter; amplifying means for amplifying the microwave signal output from the first band-pass filter; signal generating means for outputting an oscillating signal; mixing means for receiving the microwave signal from the amplifying means and the oscillating signal from the signal generating means, and mixing the signals with each other to form an intermediate-frequency signal; a second band-pass filter which removes noise from the intermediate-frequency signal output from the mixing means; intermediate-frequency amplifying means for amplifying the intermediate-frequency signal output from the second band-pass filter; converting means for converting the intermediate-frequency signal output from the intermediate-frequency amplifying means into a video signal; and video amplifying means for amplifying the video signal output from the converting means.

According to still another aspect of the invention, there is provided a microwave sensor, which comprises: an antenna unit which is to be placed in the vicinity of an electric apparatus and which receives a microwave signal generated by a discharge occurring in the electric apparatus; a first band-pass filter which allows a predetermined frequency of the microwave signal received by the antenna unit to pass through the filter; amplifying means for amplifying the microwave signal output from the first band-pass filter; signal generating means for outputting an oscillating signal; mixing means for receiving the microwave signal from the amplifying means and the oscillating signal from the signal generating means, and mixing the signals with each other to form an intermediate-frequency signal; a second band-pass filter which removes noise from the intermediate-frequency signal output from the mixing means; intermediate-frequency amplifying means for amplifying the intermediate-frequency signal output from the second band-pass filter; logarithmic amplifying and converting means for amplifying the intermediate-frequency signal output from the second band-pass filter, and converting the signal into a video signal; and video amplifying means for amplifying the video signal output from the logarithmic amplifying and converting means.

According to yet still another aspect of the invention, there is provided a microwave sensor, which comprises: in a stage preceding the amplifying means: coupling means for extracting a part of the microwave signal; comparing means for comparing an electromagnetic wave level of the microwave signal extracted by the coupling means with a predetermined value; attenuating means for attenuating the microwave signal; and switching means for switching the microwave signal to the attenuating means, and, when the electromagnetic wave level of the microwave signal supplied to the comparing means is not lower than the predetermined value, the switching means is automatically switched to the attenuating means.

According to yet still another aspect of the invention, there is provided a microwave sensor, which comprises: in a stage preceding the amplifying means, interrupting means for, when the electromagnetic wave level of the microwave signal is greater than a predetermined value, interrupting the microwave signal, the interrupting means comprising a switch and a terminator.

According to yet still another aspect of the invention, there is provided a microwave sensor, which comprises: in a stage preceding the amplifying means, a limiter which, when the electromagnetic wave level of the microwave signal is greater than a predetermined value, limits the electromagnetic wave level of the microwave signal.

In the microwave sensor of the invention, a microwave signal among electromagnetic waves generated by a discharge occurring in an electric apparatus is received, the first band-pass filter allows a predetermined frequency of the microwave signal received by the antenna unit to pass therethrough, and the amplifying means amplifies the microwave signal output from the first band-pass filter. The second band-pass filter removes noise produced by the amplifying means, the converting means converts the microwave signal output from the second band-pass filter into a video signal, and the video amplifying means amplifies the video signal output from the converting means. The video signal is displayed by arbitrary observation means so that the occurrence of the discharge is detected.

The mixing means receives the microwave signal and the oscillating signal from the signal generating means, and mixes the signals with each other to form an intermediate-frequency signal, thereby enhancing the stability of the sensor.

The logarithmic amplifying and converting means amplifies the intermediate-frequency signal, thereby increasing the response range, and converts the signal into a video signal.

When the electromagnetic wave level of the microwave signal supplied to the comparing means is not lower than a predetermined value, the switching means is automatically switched to the attenuating means so that the microwave signal is attenuated and the dynamic range of the converting means is increased.

When the electromagnetic wave level of the microwave signal is greater than a predetermined value, the interrupting means which comprises a switch and a terminator interrupts the microwave signal so as to protect the low noise amplifier from an input of an excessive level.

When the electromagnetic wave level of the microwave signal is greater than a predetermined value, the limiter limits the electromagnetic wave level of the microwave signal, thereby protecting the low noise amplifier from an input of an excessive level.

BRIEF DESCRIPTION OF THE DRAWINGS

The above and other objects and features of the present invention will be more apparent from the following description taken in conjunction with the accompanying drawings.

FIGS. 12A and 12B are diagrams showing a prior art example;

FIG. 13 is a block diagram showing a prior art example;

DETAILED DESCRIPTION OF THE PREFERRED EMBODIMENTS

Now, a description will be given in more detail of the embodiments of the invention with reference to the accompanying drawings.

Embodiment 1

Figure 1:
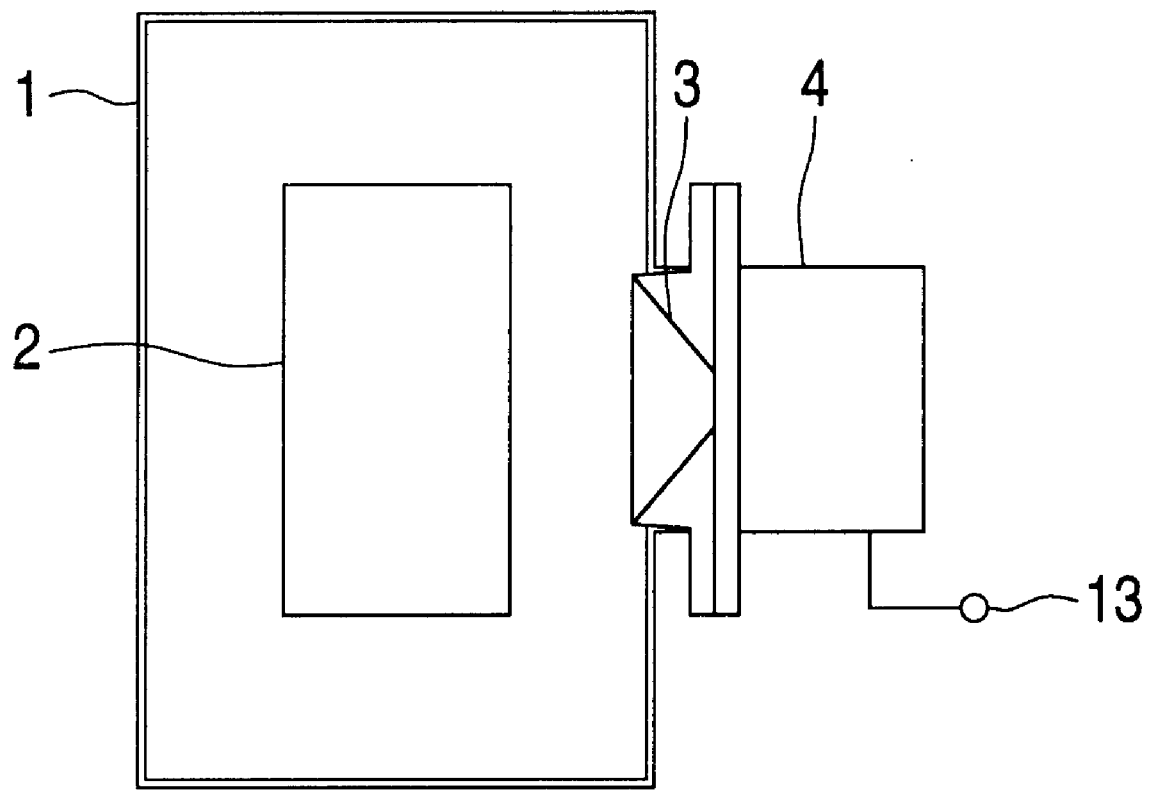
FIG. 1 is a diagram showing the configuration of an embodiment of the invention.
Figure 2A:
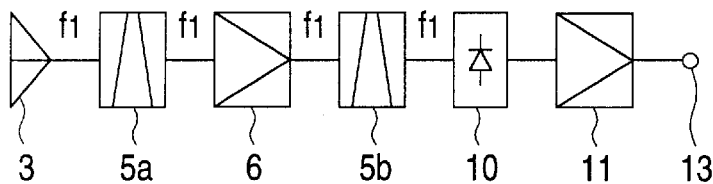
FIGS. 2A, 2B and 2C are diagrams showing the embodiment of the invention.
Figure 2B:
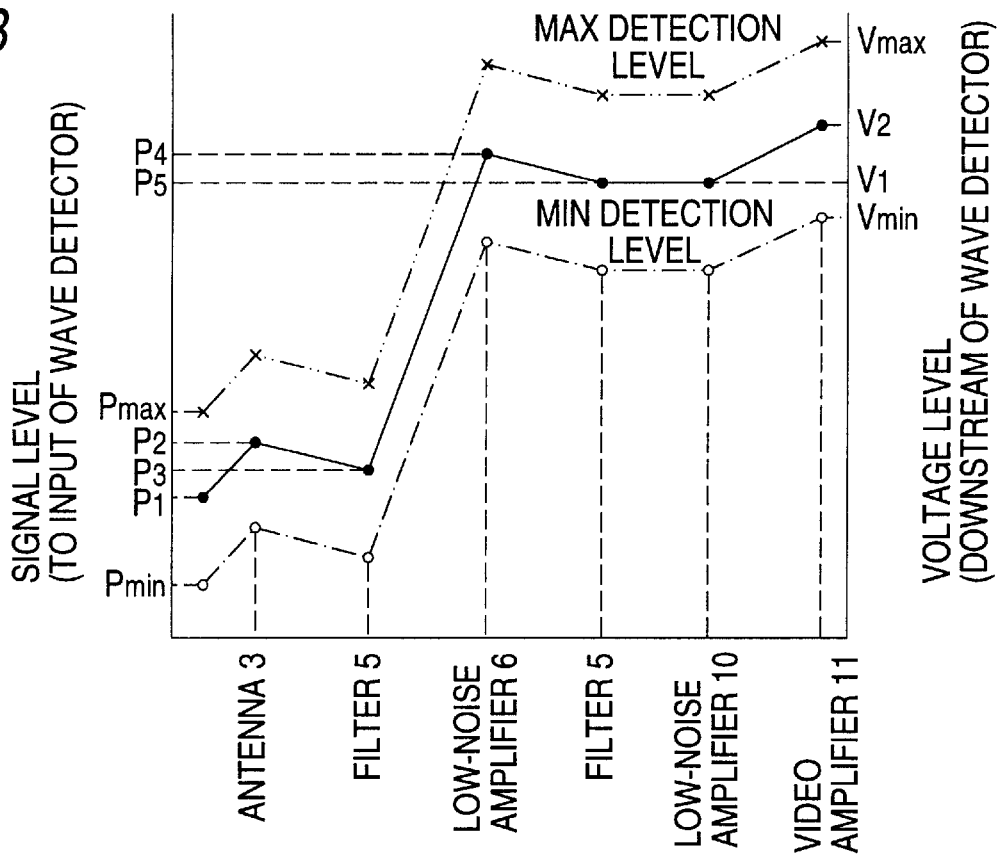
Figure 2C:
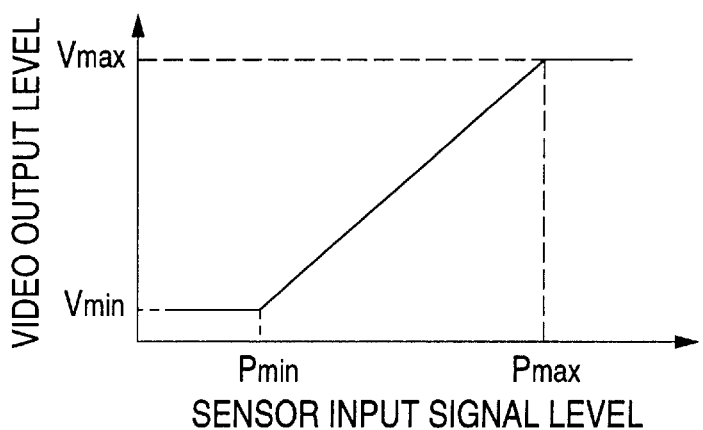

Hereinafter, an embodiment of the invention will be described with reference to the figures. FIG. 1 is a diagram showing the configuration of the sensor for an electric apparatus according to the invention, FIG. 2A is a block diagram of the sensor, FIG. 2B is a level diagram of a signal and a voltage, and FIG. 2C is a graph showing the input/output characteristics of the sensor for an electric apparatus. In FIG. 1, reference numeral 1 designates a case of an object apparatus in which a discharge may occur, 2 designates the object apparatus, 3 designates an antenna which is attached to the object apparatus case 1 and receives a microwave signal generated by a discharge, 4 designates a signal processing unit which is connected to the antenna 3, amplifies and detects the microwave signal, converts the microwave signal to a video signal, and amplifies the detected video signal, and 13 designates an output terminal through which the video signal is output. The microwave sensor is configured by the antenna 3, the signal processing unit 4, and the output terminal 13. FIG. 2A is a block diagram showing the configuration of the sensor for an electric apparatus. In the figure, reference numeral 3 designates the antenna which receives a microwave signal generated by a discharge, 5a designates a band-pass filter for the high-frequency band which allows a given frequency part of the microwave signal received by the antenna to pass therethrough, 6 designates a low-noise amplifier which amplifies the output of the band-pass filter 5a, 5b designates a band-pass filter for the high-frequency band, 10 designates a wave detector which is converting means for converting the microwave signal output from the band-pass filter 5b into a video signal, 11 designates a video amplifier which amplifies the video signal, and 13 designates an output terminal through which the video signal is output.

Figure 3A:
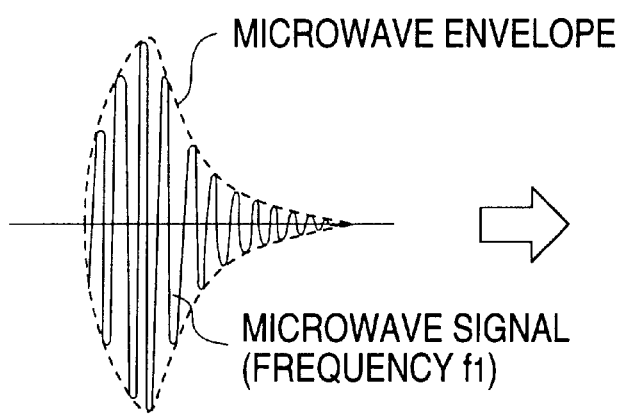
FIGS. 3A and 3B are diagrams showing an example of a display screen in the embodiment of the invention.
Figure 3B:
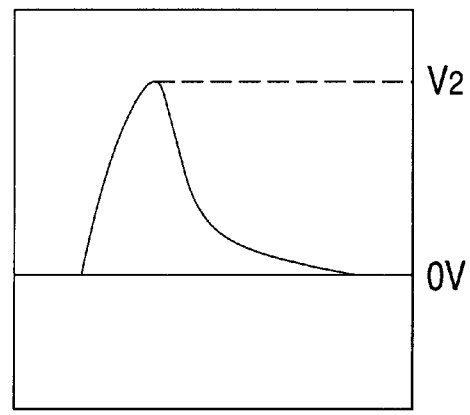
Figure 16:
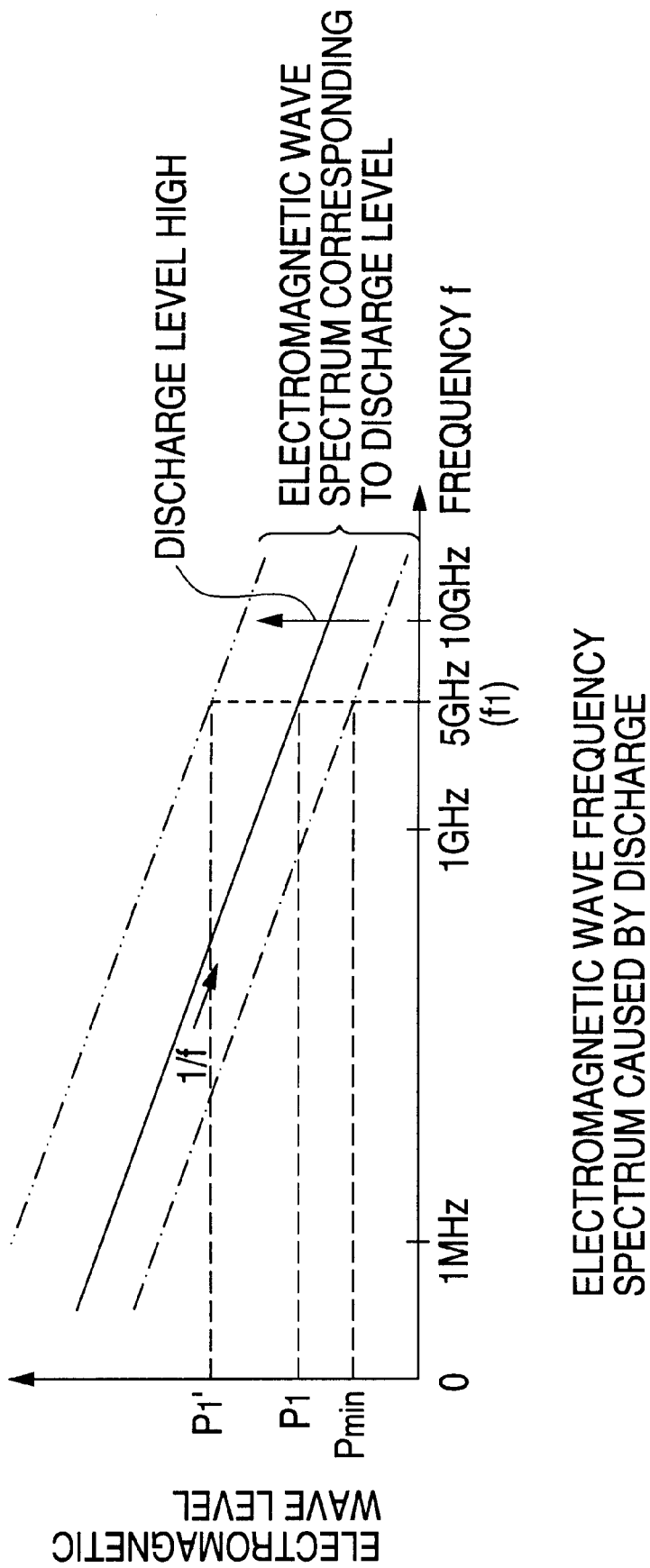
FIG. 16 is a characteristic graph of the frequency spectrum of an electromagnetic wave generated by a discharge.

Next, the operation will be described. Referring to FIGS. 2A and 2B, a microwave signal f1 (for example, 5 GHz as shown in FIG. 16) which is generated by a discharge in the apparatus and has a power of P1 is received by the antenna 3. The signal f1 is then output from the antenna 3 with an increased power P2 in accordance with the gain of the antenna. Thereafter, the signal f1 passes through the band-pass filter 5a for the high-frequency band, and the output of the filter is reduced to P3 by the loss in the filter. Thereafter, the output is amplified by the low-noise amplifier 6 to a level of P4. Only necessary signal components are allowed to pass through the band-pass filter 5b. The microwave signal is directly converted by the wave detector 10 into a video signal (of a level of V1) which is a DC signal. The video signal is amplified by the video amplifier 11 to a level of V2 and then output through the output terminal 13. As the frequency is lower, the power level (see FIG. 16) of an electromagnetic wave generated by a discharge is higher. Therefore, the band-pass filter 5a allows a frequency of f1±hundreds MHZ (for example, f1±100 MHZ) to pass therethrough so that semiconductor devices (such as the low-noise amplifier 6) of the sensor are prevented from being damaged by a low-frequency electromagnetic wave of a high power level. Noise is added to the signal f1 by noise involved in the low-noise amplifier 6. Consequently, the band-pass filter 5b is used for removing the noise. The output signal is observed by an arbitrary observation apparatus such as an oscilloscope. As shown in FIGS. 3A and 3B, for example, the positive or negative half-wave component of an envelope of the microwave signal is displayed on the screen.

In FIG. 2B, the maximum detection level is indicated by the upper line and the minimum detection level is indicated by the bottom line. Even when the frequency is the same, the electromagnetic power level is varied depending on the manner of discharge. The level of an electromagnetic wave which is generated in an initial stage of an abnormality of an electric power apparatus is very low or −100 to −80 dBm. It is required to detect the minimum level.

As the abnormality of the electric apparatus advances, the intensity of the discharge is increased, and also the level of the electromagnetic wave generated by the discharge is increased. Consequently, it is preferable to set the dynamic range to be as large as possible. However, the dynamic range is restricted by characteristics (such as saturation) of the parts to be used, whereby the maximum detection level Pmax is determined.

FIG. 2C shows the input/output characteristics of the sensor. As a result of the operation described above, a video signal which corresponds to the level of the microwave signal between the minimum and maximum detection levels Pmin and Pmax is output. The characteristics depend on those of the semiconductor devices used in the sensor, etc. When the level of the microwave signal is not higher than Pmin, therefore, the microwave signal hides behind noises of the sensor itself, resulting in that the microwave signal cannot be detected. When the level of the microwave signal is not lower than Pmax, amplifiers or the wave detector are saturated so that a video output which is higher in level than max is not obtained.

The configuration of the embodiment has a receiving sensitivity which is not so high but which is sufficient for a discharge of a high electromagnetic wave level (about −80 to −50 dBm) generated by radiation such as an arc discharge, or a spark discharge. Therefore, the embodiment is suitable for detection of an electromagnetic wave of a relatively high level.

As described above, an electromagnetic wave generated by a discharge has frequency components of a wide band from the low-frequency band to the microwave band. The bands lower than the microwave band are occupied by various electromagnetic waves such as broadcast waves and communication waves and hence are easily subjected to interference. In contrast, microwaves are restricted in application, largely attenuated in a space, and hardly affected by an electromagnetic wave in the space. Therefore, microwaves are substantially free from noise. Unlike the method in which a sound is used, the embodiment using a microwave is not required to have a countermeasure against noise which is produced by phenomena other than a discharge, and hence can correctly make judgment.

In the case where a low-frequency band is used, a device which removes noise electromagnetic waves is necessary for detection of a discharge. In the embodiment, such a device is not necessary, and the wave detector directly converts a microwave into a video signal, with the result that the circuit configuration is simple. Since the microwave band is used, furthermore, the portions of the sensor can be configured in a very small size. According to the embodiment, therefore, a microwave sensor which is miniaturized and can be economically produced is provided.

The directivity of the antenna may be used so that a discharge in an arbitrary space range is detected.

In the embodiment, the portions of the sensor can be configured in a very small size and a non-contact discharge detection method is employed. Consequently, the sensor can be attached without restrictions in insulation distance and manner of attachment.

In the embodiment, a primary phenomenon due to a discharge is electrically captured (discharge—radiation of an electromagnetic wave—detection). Therefore, a discharge is more rapidly detected and more easily judged as compared with a chemical method (discharge—heating—decomposition of organic insulators—collection—analysis—detection).

Since the sensor can be miniaturized, a number of sensors may be disposed so that the position where an electromagnetic wave is generated is analyzed on the basis of the differences in detection time and level, etc.

Embodiment 2

Hereinafter, another embodiment of the invention will be described. In an initial stage of insulation deterioration in an electric power apparatus, very small discharges mainly occur and electromagnetic waves radiated in such discharges have a low level. In the view point of the preventive maintenance of an electric power apparatus, a discharge of such a level must be detected. When the signal processing unit of a sensor is configured by the direct detecting system in which a microwave is directly converted into a DC signal as described in Embodiment 1, the gain of the low-noise amplifier 6 must be high (about 80 dB). In this case, the amplifier easily oscillates so that it is difficult to conduct the detection.

The embodiment is configured so that an electromagnetic wave of a low level is detected without requiring the low-noise amplifier 6 to have a high gain.

Figure 4:
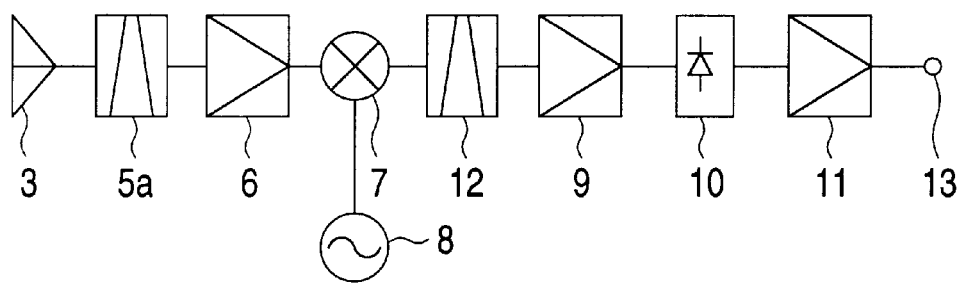
FIG. 4 is a block diagram showing another embodiment of the invention.

FIG. 4 is a block diagram showing the configuration of a microwave sensor. In the figure, the components designated by reference numerals 3, 5*a*, 6, 10, 11, and 13 are the same as those of FIG. 2A showing Embodiment 1, and their description is omitted. Reference numeral 7 designates a mixer which outputs an intermediate-frequency signal corresponding to the difference between the frequency of the microwave signal output from the low-noise amplifier 6 and a given frequency which is oscillated by an oscillator 8. Reference numeral 12 designates a band-pass filter for the intermediate-frequency band which removes undesired frequency components generated in the mixer 7, and 9 designates an intermediate-frequency amplifier which amplifies the output of the band-pass filter 12.

Next, the operation will be described. The antenna 3 receives the microwave signal f1 generated by a discharge occurring in an apparatus. The signal f1 is passed through the band-pass filter 5*a*, amplified by the low-noise amplifier 6 to a predetermined level, and then fed to the mixer 7. A signal of a frequency of f2 is supplied from the output of the oscillator 8 to the mixer 7. As a result, a signal of an intermediate frequency of f3=f1−f2 is output from the mixer 7. The frequency f2 is previously determined so that the signal f3 has an intermediate frequency of about hundreds MHZ. A necessary signal is taken out from the signal by the band-pass filter 12, amplified by the intermediate-frequency amplifier 9, and then converted into a video signal by the wave detector 10. The video signal is amplified by the video amplifier 11 and then output through the output terminal 13. When the mixer 7 conducts the frequency conversion, undesired frequencies of 2f1−f2 and 2f2−f1 are generated. The band-pass filter 12 is used for removing these undesired frequencies. The output signal delivered from the output terminal is observed by an arbitrary observation apparatus such as an oscilloscope.

When amplification is to be conducted at a single frequency, a low-noise amplifier must have a high gain. In an amplifier for a single frequency and of a high gain, however, there often arise problems such as oscillation. In the configuration described above, the frequency is converted and the amplifiers are separately provided for the high-frequency and intermediate-frequency portions, respectively. Therefore, the stability of the sensor is increased and problems such as oscillation are prevented from arising. The gain of an amplifier can be made higher in a stable manner as the frequency is lower. Consequently, the gain of the intermediate-frequency amplifier 9 can be easily set to be higher and that of the low-noise amplifier 6 to be lower, so that an electromagnetic wave which is generated by a discharge and has a low level is surely detected, thereby improving the detection performance.

Embodiment 3

The embodiment which has been conducted in order to expand the response range will be described with reference to the figure.

Figure 5:
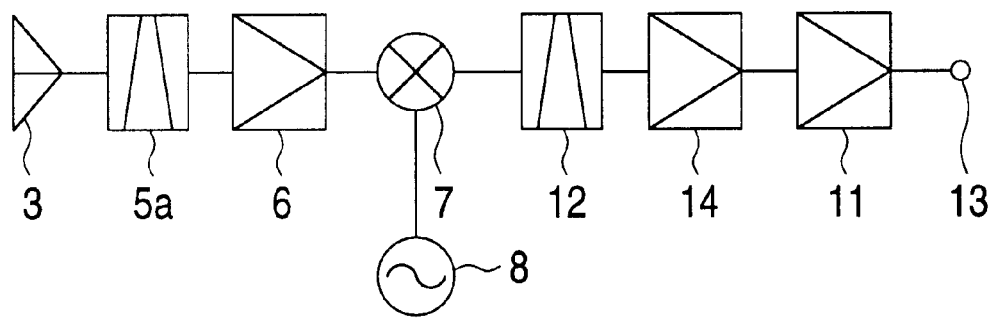
FIG. 5 is a block diagram showing a further embodiment of the invention.

FIG. 5 is a block diagram showing the configuration of a microwave sensor. In the figure, the components designated by reference numerals 3, 5*a*, 6, 7, 8, 12, 11, and 13 are the same as those of FIG. 4 showing Embodiment 2, and their description is omitted. Reference numeral 14 designates a logarithmic amplifier which conducts linear-logarithmic conversion and amplification on the output of the band-pass filter 12 and then outputs it in the form of a video signal.

Next, the operation will be described. The antenna 3 receives the microwave signal f1 generated by a discharge occurring in an apparatus. The signal f1 is passed through the band-pass filter 5*a*, amplified by the low-noise amplifier 6 to a predetermined level, and then fed to the mixer 7.

A signal of a frequency of f2 is supplied from the output of the oscillator 8 to the mixer 7. As a result, a signal of an intermediate frequency of f3=f1−f2 is output from the mixer 7. The signal f3 output from the mixer 7 passes through the band-pass filter 12 for the intermediate-frequency band so that only a necessary signal is extracted. The extracted signal is subjected to linear-logarithmic conversion and amplification in the logarithmic amplifier 14, and then output in the form of a video signal. The video signal is amplified by the video amplifier 11 and then output.

According to this configuration, in contrast to the response range of about 20 to 30 dB in Embodiment 2, the embodiment can ensure the response range of 50 to 60 dB, with the result that an increase of at least 20 dB is attained. Therefore, a 100-fold response range can be obtained at the minimum.

According to this configuration, the response range can be expanded and the detection performance can be further improved.

Embodiment 4

Figure 6:
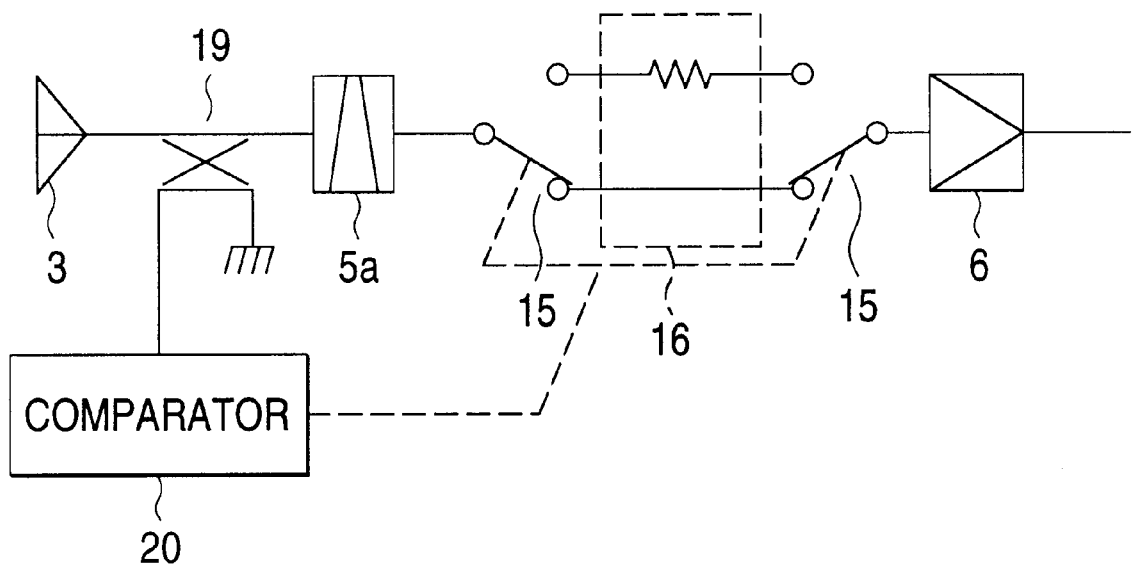
FIG. 6 is a block diagram showing a still further embodiment of the invention.

The embodiment which has been conducted in order to ensure the dynamic range of the sensor in Embodiments 1 and 2 will be described with reference to the figure. FIG. 6 is a block diagram of portions of a microwave sensor ranging from the antenna 3 to the low-noise amplifier 6. In the figure, the components designated by reference numerals 3, 5a, and 6 are the same as those of FIG. 2 showing Embodiment 1, and their description is omitted.

Reference numeral 15 designates a switch for switching an attenuator group 16, 19 designates a coupler which extracts a part of the microwave signal, and 20 designates a comparator which conducts a comparison on the microwave signal extracted by the coupler 19 and supplies a signal to the switch 15. The portions following the low-noise amplifier are the same as those of Embodiments 1 and 2.

Next, the operation will be described. The antenna 3 receives the microwave signal f1 generated by a discharge occurring in an apparatus. The signal f1 passes through the band-pass filter 5a, and also the attenuator group 16 to which the switch 15 is switched so that the level of the signal is attenuated. Thereafter, the signal is fed to the low-noise amplifier 6. The dynamic range of the wave detector 10 is limited to about 30 dB. When the detected signal is changed in level by the attenuator 16 so that the input signal of the wave detector 10 is adjusted, the dynamic range of the sensor can be increased to a larger value, for example, 60 dB in the case where the value of the attenuator is 30 dB. The operations following the low-noise amplifier are the same manner as those of Embodiments 1 and 2.

The switch 15 is automatically switched by a control signal. The control signal is output from the comparator 20 which compares the level of the part of the microwave signal f1 extracted by the coupler 19 with a given level.

According to this configuration, the dynamic range of the sensor can be increased and the detection performance can be further improved.

Embodiment 5

Figure 7:
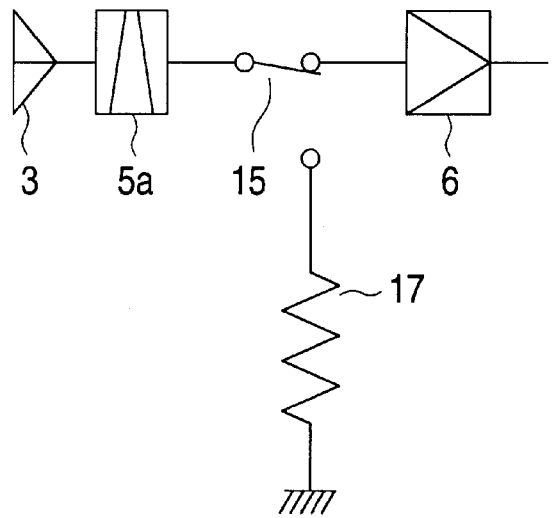
FIG. 7 is a block diagram showing a still further embodiment of the invention.

Hereinafter, the embodiment will be described with reference to the figure. FIG. 7 is a block diagram of portions of a microwave sensor ranging from the antenna 3 to the low-noise amplifier 6. In the figure, the components designated by reference numerals 3, 5a, 15, and 6 are the same as those of FIGS. 2 and 6, and their description is omitted. Reference numeral 17 designates a terminator to which the microwave signal is allowed to be input by the switching operation of the switch 15.

Next, the operation will be described. The antenna 3 receives the microwave signal f1 generated by a discharge occurring in an apparatus. The signal f1 is passed through the band-pass filter 5a and then fed to the low-noise amplifier 6 via the switch 15. The operations following the low-noise amplifier are the same as those of Embodiments 1 to 3. The switch 15 is normally connected to the low-noise amplifier 6. In some apparatuses to which the sensor is to be attached, there may be case where, judging from the operating condition, it is apparent that a discharge or the like occurs and hence the sensor may be subjected to an input of an excessive level. In such a case, the state of the switch 15 is changed so that the switch is connected to the terminator 17. This prevents the low-noise amplifier 6 from an input of an excessive level, thereby enhancing the reliability of the sensor.

In the same manner as FIG. 6 showing Embodiment 4, a detector which comprises the coupler 19 and the comparator 20 may be connected in a stage preceding the switch 15 so that, when a signal of an excessive level which may destroy the low-noise amplifier 6 is input, the switch 15 is automatically switched to the terminator 17.

According to this configuration, the low-noise amplifier can be protected from an input of an excessive level, thereby enhancing the reliability of the sensor.

Embodiment 6

Figure 8:
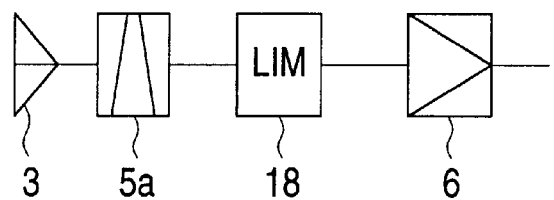
FIG. 8 is a block diagram showing a still further embodiment of the invention.
Figure 9:
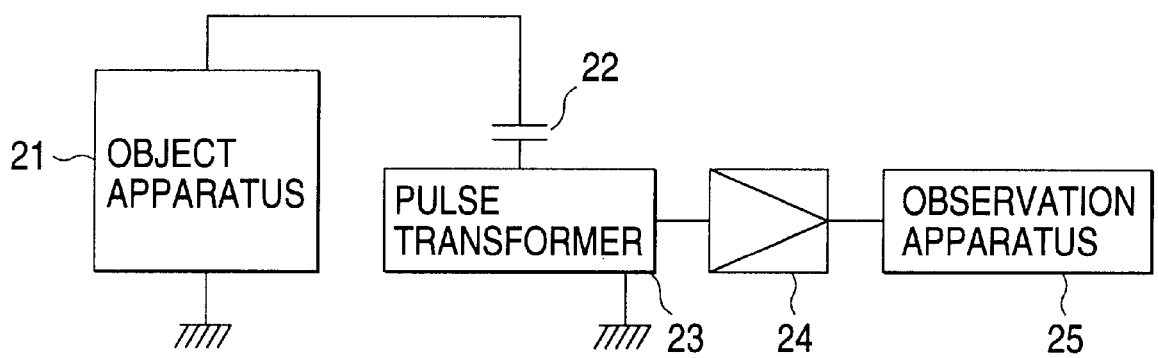
FIG. 9 is a block diagram showing a prior art example.
Figure 10:
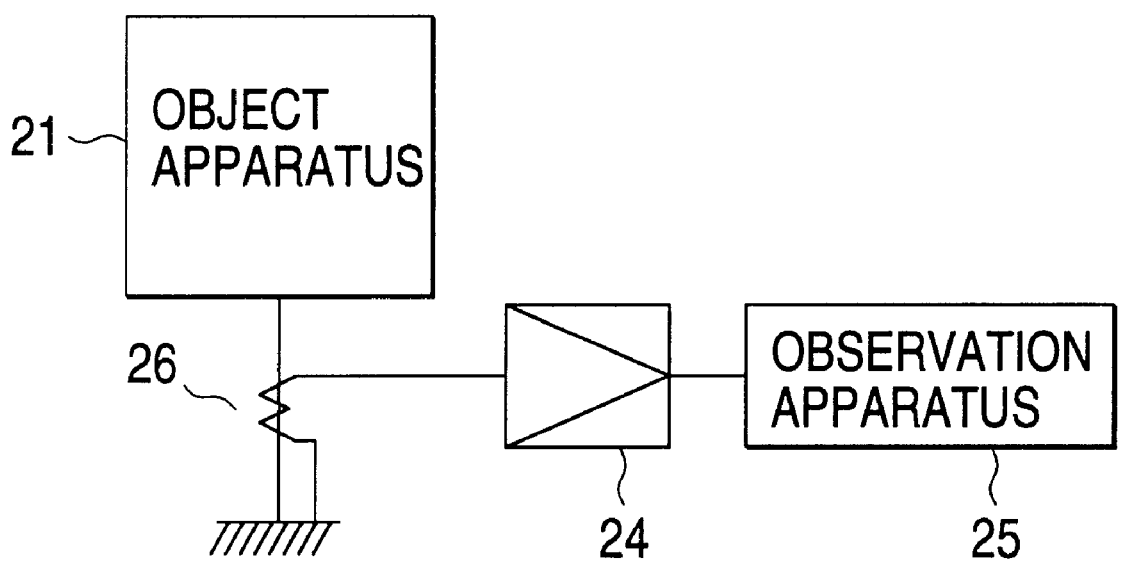
FIG. 10 is a block diagram showing a prior art example.
Figure 11:
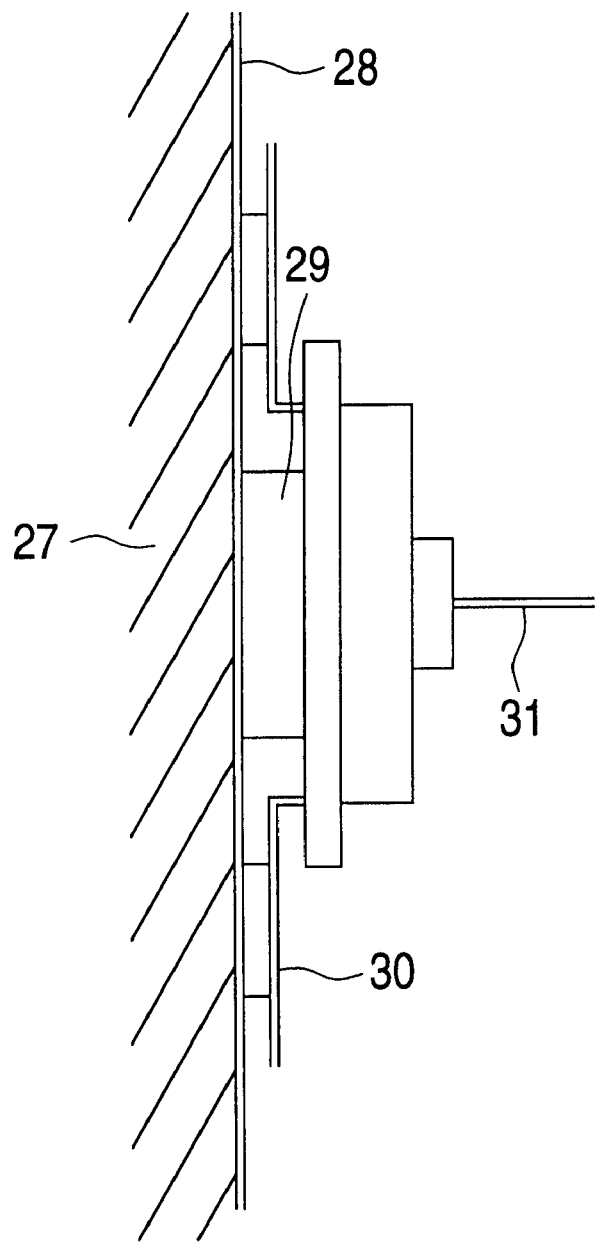
FIG. 11 is a diagram showing a prior art example.
Figure 14:
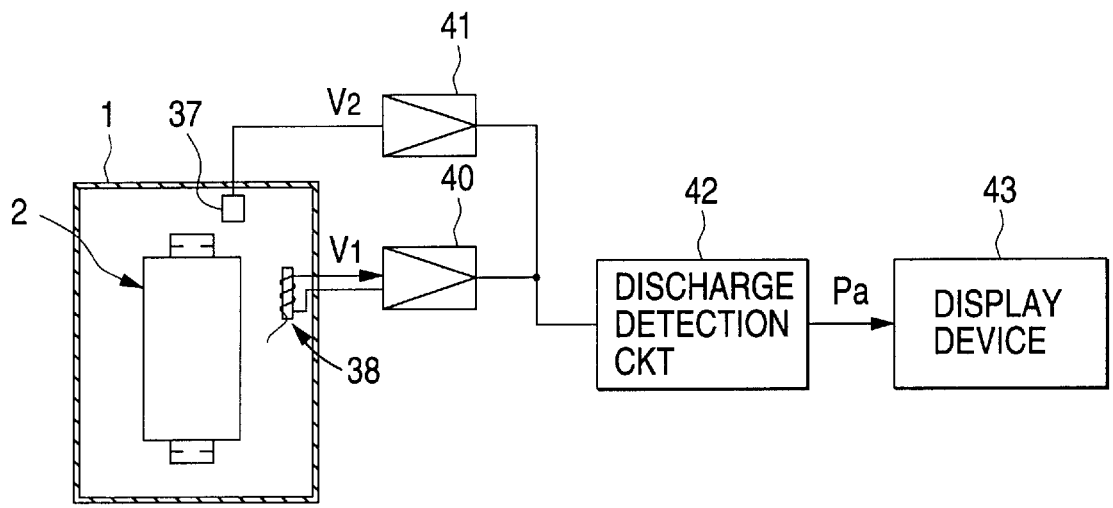
FIG. 14 is a block diagram showing a prior art example.
Figure 15A:
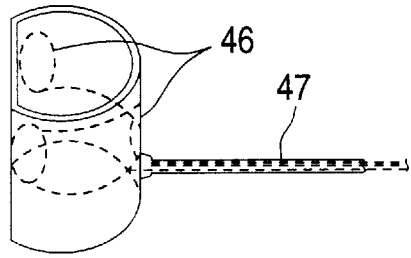
FIGS. 15A and 15B are diagrams showing a prior art example.
Figure 15B:
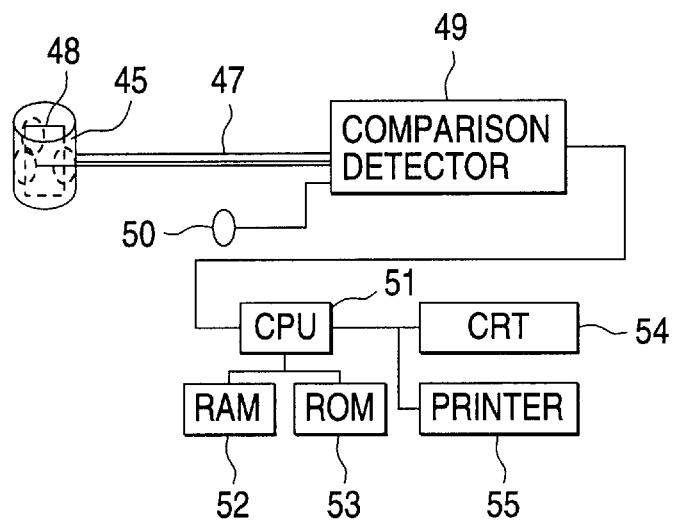

Hereinafter, the embodiment will be described with reference to the figure. FIG. 8 is a block diagram of portions of a microwave sensor ranging from the antenna to the low-noise amplifier. In the figure, the components designated by reference numerals 3, 5a, and 6 are the same as those of FIG. 2, and their description is omitted. Reference numeral 18 designates a limiter which prevents a microwave signal of an excessive level from entering.

Next, the operation will be described. The antenna 3 receives the microwave signal f1 generated by a discharge occurring in an apparatus. The signal f1 is passed through the band-pass filter 5a and then fed to the low-noise amplifier 6 via the limiter 18 for protection against an input of an excessive level. The operations following the low-noise amplifier are the same as those of Embodiments 1 to 3. In a normal use state, the level of an electromagnetic wave entering the sensor is very low. When an unexpected phenomenon occurs in the object apparatus to which the sensor is attached, there may be case where an electromagnetic wave of an excessive level enters the antenna 3 and destroys electronic devices of the sensor. In order to protect the low-noise amplifier 6 from such an unexpected phenomenon, the limiter 18 is inserted into the stage preceding the low-noise amplifier 6 so that a signal which is higher than a certain level does not enter the amplifier. This prevents the low-noise amplifier 6 from an input of an excessive level so that the reliability of the sensor is enhanced.

According to this configuration, the low-noise amplifier can be protected from an input of an excessive level, thereby enhancing the reliability of the sensor.

Embodiment 7

Hereinafter, a further embodiment of the invention will be described.

Figure 17:
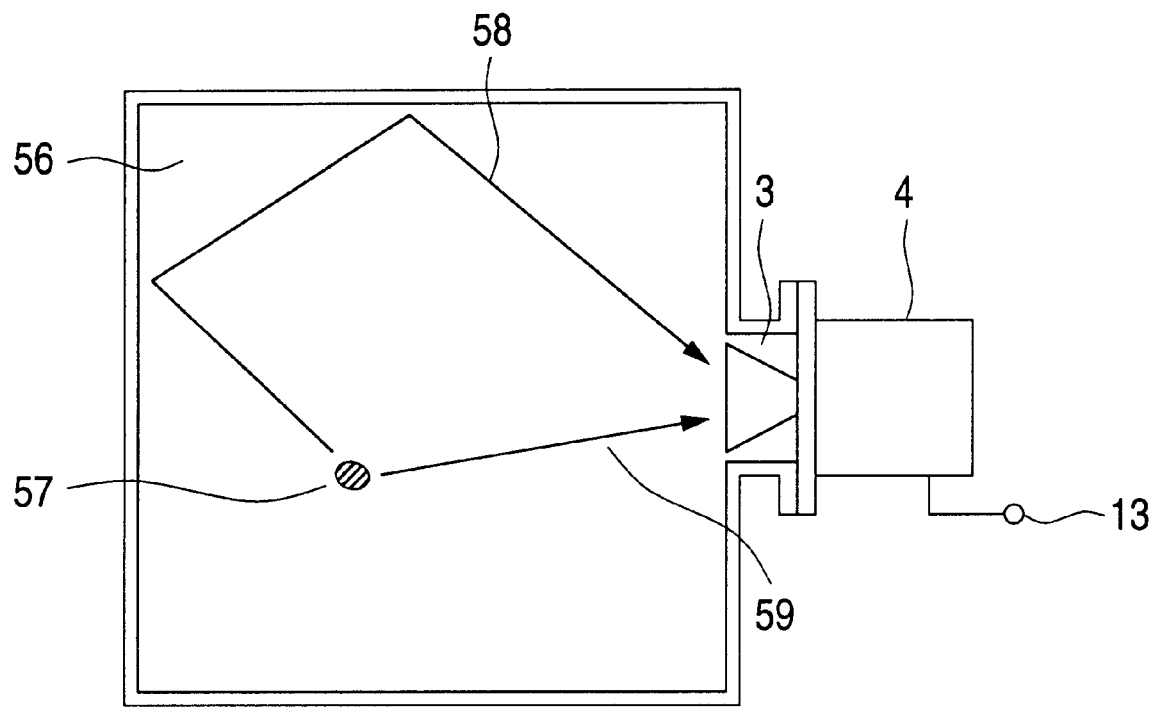
FIG. 17 is a diagram showing a still further embodiment of the invention.

FIG. 17 is a diagram showing the operation of a microwave sensor which is directed toward a closed space configured by a metal. In the figure, reference numerals 3, 4, and 13 designate an antenna of the microwave sensor of the invention, a signal processing unit, and a video output, respectively, 56 designates a closed space such as a case which is hermetically closed by a metal, 57 designates a discharge source, and 58 and 59 designate propagation paths for an electromagnetic wave.

Next, the operation will be described. When a discharge once occurs in the closed space 56, electromagnetic waves are radiated from the discharge point in three-dimensional surrounding directions. When the radiated electromagnetic waves are propagated and reach the wall of the closed space 56, the electromagnetic waves 58 are reflected because the wall of the closed space 56 is made of a metal. As a result of repetition of this process, the electromagnetic waves reach the antenna 3 of the microwave sensor while being repeatedly reflected in the closed space. It is a matter of course that some electromagnetic waves 59 from the discharge point directly reach the antenna 3. Therefore, the direct waves 59 and the reflected waves 58 from the discharge point reach the antenna 3 of the microwave sensor with being synthesized with each other. Consequently, the level of the received signal is increased so that the sensitivity is increased.

As described above, when a discharge in a closed space is to be detected, direct waves and reflected waves which are generated by the discharge reach the antenna with being synthesized with each other. Therefore, the level of the received signal is increased and hence the sensitivity is increased. An electromagnetic wave generated by a discharge can be detected on the basis of a reflected wave. Even when an obstruction exists between the discharge point and the microwave sensor, therefore, it is possible to detect the discharge. Consequently, the number of sensors to be disposed can be reduced, and the degree of freedom of selection of mounting positions can be increased.

As is described above, according to the invention, the microwave sensor comprises: an antenna unit which receives a microwave signal generated by a discharge occurring in an electric apparatus; a first band-pass filter which allows a predetermined frequency of the microwave signal received by the antenna unit to pass therethrough; amplifying means for amplifying the microwave signal output from the first band-pass filter; a second band-pass filter which removes noise produced by the amplifying means; converting means for converting the microwave signal output from the second band-pass filter into a video signal; and video amplifying means for amplifying the video signal output from the converting means. Therefore, the microwave sensor is not affected by a disturbance, has high reliability, and can surely detect a discharge. Since the microwave band is used, furthermore, the body of the sensor can be miniaturized. This allows a number of sensors to be attached to an apparatus so that the position is determined.

The microwave sensor comprises signal generating means for outputting an oscillating signal, and mixing means for receiving the microwave signal from the amplifying means and the oscillating signal from the signal generating means, and mixing the signals with each other to form an intermediate-frequency signal. Therefore, the stability of the sensor is increased and a discharge of a low level can be surely detected.

Furthermore, the microwave sensor comprises logarithmic amplifying means for amplifying the intermediate-frequency signal, and converting the signal into a video signal. Therefore, the response range can be increased and the detection performance can be further improved.

When the electromagnetic wave level of the microwave signal supplied to the comparing means is not lower than a predetermined value, the switching means is automatically switched to the attenuating means. Therefore, the dynamic range of the sensor can be increased and the detection performance can be further improved.

The microwave sensor comprises interrupting means for, when the electromagnetic wave level of the microwave signal is greater than a predetermined value, interrupting the microwave signal. The interrupting means comprises a switch and a terminator. Therefore, the low-noise amplifier can be protected from an input of an excessive level, thereby enhancing the reliability of the sensor.

The microwave sensor comprises a limiter which, when the electromagnetic wave level of the microwave signal is greater than a predetermined value, limits the electromagnetic wave level of the microwave signal which is fed to low-noise amplifier. Therefore, the low-noise amplifier can be protected from an input of an excessive level, thereby enhancing the reliability of the sensor.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A microwave sensor comprising:

an antenna unit which is to be placed in the vicinity of an electric apparatus and which receives a microwave signal generated by a discharge occurring in the electric apparatus;

a first band-pass filter which allows a predetermined frequency of the microwave signal received by said antenna unit to pass through said filter;

amplifying means for amplifying the microwave signal output from said first band-pass filter;

signal generating means for outputting an oscillating signal;

mixing means for receiving the microwave signal from said amplifying means and the oscillating signal from said signal generating means, and mixing said signals with each other to form an intermediate-frequency signal;

a second band-pass filter which removes noise from the intermediate-frequency signal output from said mixing means;

intermediate-frequency amplifying means for amplifying the intermediate-frequency signal output from said second band-pass filter;

converting means for converting the intermediate-frequency signal output from said intermediate-frequency amplifying means into a video signal; and video amplifying means for amplifying the video signal output from said converting means.

2. A microwave sensor according to claim 1, further comprising in a stage preceding said amplifying means: coupling means for extracting a part of the microwave signal; comparing means for comparing an electromagnetic wave level of the microwave signal extracted by said coupling means with a predetermined value; attenuating means for attenuating the microwave signal; and switching means for switching the microwave signal to said attenuating means, and, when the electromagnetic wave level of the microwave signal supplied to said comparing means is not lower than the predetermined value, said switching means is automatically switched to said attenuating means.

3. A microwave sensor according to claim 1, further comprising, in a stage preceding said amplifying means, interrupting means for, when the electromagnetic wave level of the microwave signal is greater than a predetermined value, interrupting the microwave signal, said interrupting means comprising a switch and a terminator.

4. A microwave sensor according to claim 1, further comprising, in a stage preceding said amplifying means, a limiter which, when the electromagnetic wave level of the microwave signal is greater than a predetermined value, limits the electromagnetic wave level of the microwave signal.

* * * * *